(12) United States Patent
Springer

(10) Patent No.: US 6,485,565 B1
(45) Date of Patent: Nov. 26, 2002

(54) PROCESS AND APPARATUS FOR MAKING ORIENTED CRYSTAL LAYERS

(75) Inventor: Robert W. Springer, Los Alamos, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 09/909,476

(22) Filed: Jul. 19, 2001

Related U.S. Application Data

(62) Division of application No. 09/321,909, filed on May 28, 1999
(60) Provisional application No. 60/087,367, filed on May 28, 1998.

(51) Int. Cl.$^7$ .............................................. C30B 23/08
(52) U.S. Cl. ...................... 117/201; 117/201; 118/715; 118/723 CE; 118/729; 118/730; 204/192.34
(58) Field of Search .................... 204/289.89, 192.34; 117/200, 201; 118/715, 723 CB, 729, 730

(56) References Cited

U.S. PATENT DOCUMENTS

| | | | | |
|---|---|---|---|---|
| 4,847,504 A | * | 7/1989 | Aitken | 250/492.2 |
| 5,221,636 A | | 6/1993 | Landreau et al. | 437/129 |
| 5,223,109 A | * | 6/1993 | Itoh et al. | 204/192.34 |
| 5,525,199 A | | 6/1996 | Scobey | 204/192.26 |
| 5,601,654 A | | 2/1997 | Springer | 118/723 |
| 5,798,029 A | | 8/1998 | Morita | 204/298.16 |
| 5,849,078 A | | 12/1998 | Tomita et al. | 117/102 |
| 6,123,814 A | | 9/2000 | Dubs et al. | 204/192.26 |

FOREIGN PATENT DOCUMENTS

JP 084002 10/1986

OTHER PUBLICATIONS

"Ion–Beam Assisted Deposition of Biaxially Aligned Magnesium Oxide Template Films for Yttrium–Barium–Copper–Oxide Coated Conductors," Groves et al., presented to 1998 Applied Superconductivity Conference of the American Chemical Society, Palm Springs, California, Sep. 13–18, 1998.

"Large Area Polycrystalline Diamond Films as High Current Photocathodes for Linear Induction Accelerators," Shurter et al., presented to the 8th European Conference on Diamond, Diamond–like and Related Materials and 4th International Conference on the Applications of Diamond films and Related Materials, Heriot–Watt University, Edinburgh, Scotland, Aug. 3–8, 1997.

* cited by examiner

*Primary Examiner*—Robert Kunemund
(74) *Attorney, Agent, or Firm*—Gemma Morrison Bennett

(57) ABSTRACT

Thin films of single crystal-like materials are made by using flow-through ion beam deposition during specific substrate rotation around an axis in a clocking action. The substrate is quickly rotated to a selected deposition position, paused in the deposition position for ionized material to be deposited, then quickly rotated to the next selected deposition position. The clocking motion can be achieved by use of a lobed cam on the spindle with which the substrate is rotated or by stopping and starting a stepper motor at long and short intervals. Other symmetries can be programmed into the process, allowing virtually any oriented inorganic crystal to be grown on the substrate surface.

16 Claims, 5 Drawing Sheets

PROCESS AND APPARATUS FOR MAKING ORIENTED CRYSTAL LAYERS

This application is a divisional of patent application Ser. No. 09/321,909 filed May 28, 1999, and claims the benefit of U.S. Provisional Application No. 60/087,367 filed May 28, 1998, now copending.

This invention was made with government support under Contract No. W-7405-ENG-36 awarded by the U.S. Department of Energy. The government has certain rights in the invention.

TECHNICAL FIELD

This invention relates to deposition of inorganic oriented crystal layers using ion beam deposition technology.

BACKGROUND

Crystallites having the same orientation with respect to the plane of the substrate but twisted relative to each other have been produced. While this property is useful for catalysis, hardness or corrosion properties, materials having this property are not useful as seed layers for electronic materials. Electronic materials must be as defect free as possible, and they need to be single crystals or single crystal-like to achieve optimum electrical performance. These materials have been produced using molecular beam epitaxy, which requires the use of a single crystal surface on which to grow the electronic material and multiple sources. Therefore, there is a need for simpler, faster methods of production that can build oriented crystal layers on substrates other than single-crystal substrates, particularly for uses such as high temperature material applications.

It is an object of this invention to provide an apparatus and method for deposition of oriented crystal layers on substrate materials.

It is another object of this invention to provide an apparatus and method for producing a single crystal like substrate on inexpensive amorphous materials such as glass.

It is a further object of this invention to provide an apparatus and method for deposition of oriented crystal layers on substrate materials in high vacuum rather than ultrahigh vacuum environments.

It is yet another object of this invention to provide an apparatus and method for producing single crystal like substrates that will allow the growth of high quality oriented crystal materials.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims. The claims are intended to cover all changes and modifications within the spirit and scope thereof.

DISCLOSURE OF INVENTION

To achieve the foregoing and other objects, and in accordance with the purposes of the present invention, as embodied and broadly described herein, thin films of oriented crystals have been made by using flow through ion beam deposition during specific substrate rotation about an axis in a clocking action. The substrate is quickly rotated to a selected deposition position, paused in the deposition position for ionized material to be deposited, then quickly rotated to the next selected deposition position.

The clocking motion can be achieved by use of a lobed cam on the spindle with which the substrate is rotated or by stopping and starting a stepper motor at long and short intervals. The deposition positions are selected in accordance with the orientation and structure of the crystals to be deposited on the substrate. For example, the substrate is rotated from 12 to 3 to 6 to 9 and back to 12 during deposition for four-fold symmetry type crystals. Other symmetries can be programmed into the process, allowing virtually any oriented inorganic crystal to be grown on the substrate surface.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

BEST MODES FOR CARRYING OUT THE INVENTION

A substrate holder and rotator has been developed to allow deposition of single crystal and single crystal-like material using a flow through ion beam source such as that described in U.S. Pat. No. 5,601,654 (Springer, Feb. 11, 1997).

The substrate, which can be any solid material, but is usually a wafer or thin slab, is attached to a holder which is rotatable about an axis having a shaft attached to a cam which uses a timing circuit with relay for powering a vacuum motor which rotates the cam shaft.

The cam can have any of a great number of symmetries. The cam selection is determined by the symmetry of the selected crystal or crystals and the desired orientation of deposited material relative to the substrate. For example, if it is desired to use a hexagonal crystal and obtain a C axis perpendicular to the substrate, a six-fold clocking motion would be required. This is because the resulting film would look like a "honey comb" of crystals when looking straight down on the coated substrate.

Alternatively, the shaft is connected to a stepper motor which rotates the substrate in a clocking fashion. The stepper motor can be programmed to allow any symmetry to be used during deposition.

The substrate in the holder is contacted with electrons and ions from a flow through ion beam source in a high vacuum (as opposed to an ultrahigh vacuum) atmosphere. This may be accomplished by using any suitable atmosphere-controlled container.

Although some heating of the substrate occurs as a result of the evaporation process and the energy from the ion beam source, no heat is required for the invention method to operate effectively. The substrate can be cooled if desired for purposes of using substrates which otherwise could not be used because of the heat used in other coating methods.

The angle of the whole apparatus or the substrate holder portion of the apparatus can be changed with respect to the ion beam axis to control the orientation of the crystallites. Alternatively, the ion beam source can be mounted in a manner that permits changes in the angle the ions are deposited upon the substrate.

The ion beam source is supplied with various feed materials such as oxides or metals for forming the oriented films on the substrates.

Figure 1:
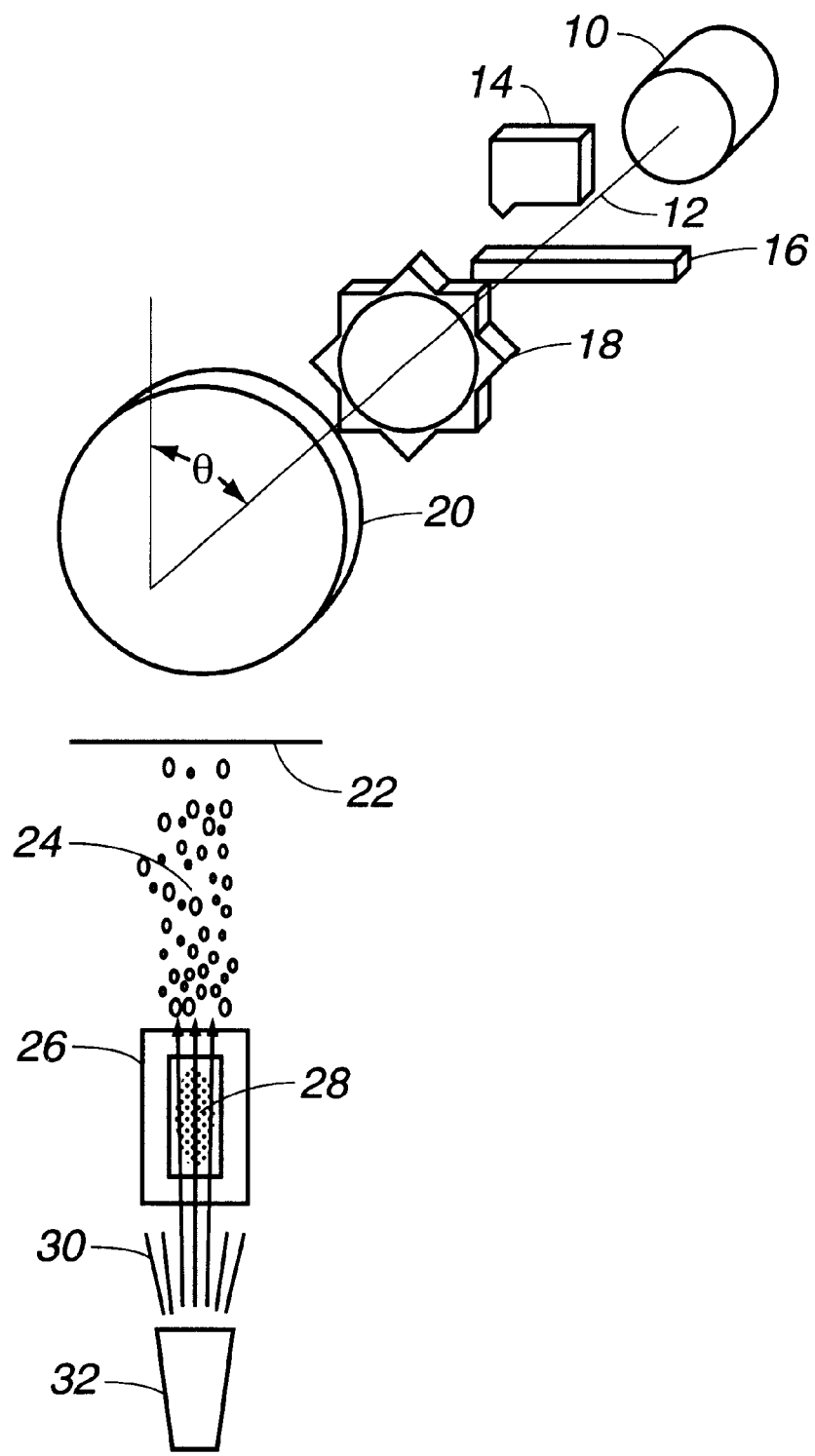
FIG. 1 is a schematic of one embodiment of the invention with the substrate holder and rotator shown in exploded view.

FIG. 1 is a schematic of one embodiment of the invention with the substrate holder and rotator shown in exploded view. In this embodiment an eight-sided cam is used for rotating the substrate in stepped fashion. Cams with differing numbers of lobes can be used to clock the substrate for different symmetries.

With reference to FIG. 1, the shaft 12 of a vacuum motor 10 is connected to the substrate holder 20 and serves to power rotation of the substrate holder 20. A vacuum switch 14 is used to keep the motor running until the next lobe falls under the cam follower, opening the switch and stopping the movement.

Figure 2:
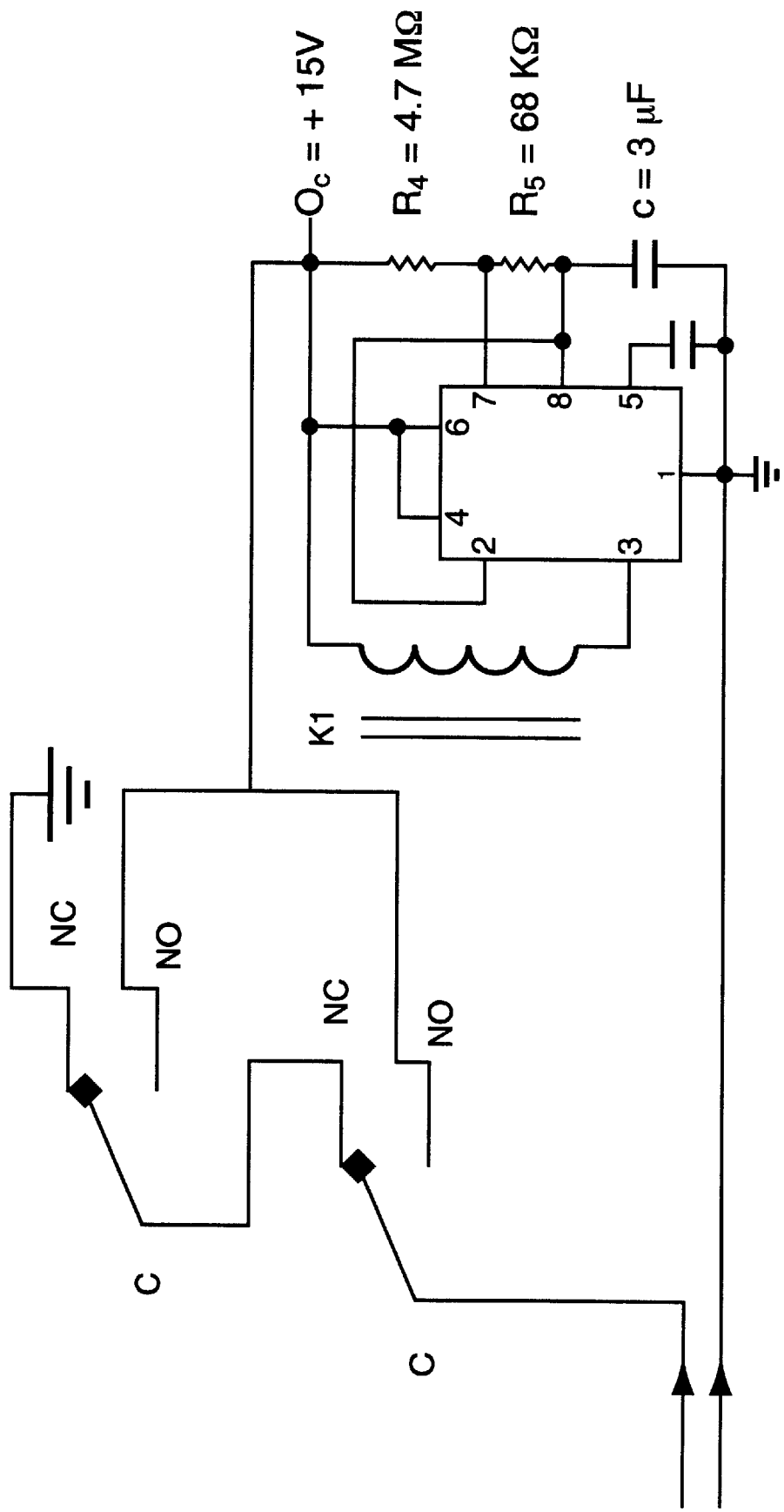
FIG. 2 shows an electrical timing circuit which may be used in the invention.

A timing device is connected to the vacuum switch to start the rotation after a certain amount of deposition has occurred. A simple timing circuit such as that shown in FIG. 2 can be used for this purpose.

When the integrated circuit timer fires, the relay closes for a short period, starting the motor. As the motor moves, the vacuum switch changes to the normally open position. When the timer runs out, the relay opens but power still flows through K1 and the relay is normally open until the low point of the cam is reached, returning the vacuum switch to the normally closed position. This action then causes the relay to return to the normally closed position.

When the relay switch returns to the normally closed position, the motor is biased to operate in the reverse direction to act as a brake to stop the cam sharply and to ensure that the position is the same every event. As the shape of the cam does not allow backward rotation, the substrate rotator becomes firmly fixed in position.

The timer circuit uses a timer chip such as a NE555 timer chip. The duty cycle, or time between clocking events, is programmed by the use of two resistors and a capacitor using readily available reference material on the timer chip.

A duty cycle in the range from about 20 seconds to about 60 seconds is presently preferred for the deposition at the cam points when stopped depending upon deposition rate and substrate angle relative to the deposition angle. About 0.5 second is used to turn the substrate holder.

When the timer "fires" the substrate holder is "clocked" to the next indentation in the cam, the switch is opened, the motor is stopped and reversed to ensure that the clocking position is exact.

A cam follower 16 is connected to the stationary motor housing and rests on the cam. A cam 18 attached to the motor shaft 12 is rotated by the shaft 12 of the vacuum motor 10.

The preferred speed of rotation is relatively short, generally in the range from about 0.1 seconds to about 1 second. The speed of rotation should be relatively fast so that not much deposition occurs during each rotation.

The differing circumference of the rotating cam 18 produces a "clocking" rather than constant rotation of the substrate holder 20. For example, the eight-sided cam 18 shown in FIG. 1 will rotate the substrate holder 20 in increments of 45 degrees each clocking cycle, as determined by the timer circuit.

Any of a large number of various cam configurations can be used, depending upon what crystal symmetry is desired. Useful cam configurations include, but are not limited to, 3, 4, 6 and 8 lobes.

The vertical plane of the substrate holder 20 can be positioned at varying angles θ relative to the ion beam 24 of electrons and ions. The angles desired for producing the selected crystal orientation are set at the beginning of production of each layer of material and can be different for different layers of material being deposited. The invention method and apparatus can be used to deposit layers of material as thin as about 100 angstroms and as thick as hundreds of microns.

Materials which can be used for deposition onto the substrate to form the oriented crystal layers include, but are not limited to, magnesium oxide, titanium nitride, yttrium stabilized zirconia, other cubic materials and mixtures thereof.

Still with reference to FIG. 1, in this embodiment of the invention, the material from which the oriented crystal layer is to be formed is placed into a reservoir 32 or vessel from which the material can be evaporated by any suitable means, such as irradiation with a laser beam, heating in a boat by resistive methods, or by electron beam source techniques. The evaporated material 30 enters the flow through ion source 26 where it can be ionized in a plasma gas 28 which produces a ion beam 24 of electrons and ions which are directed onto the surface 22 where the oriented crystal film is being grown.

Figure 3:
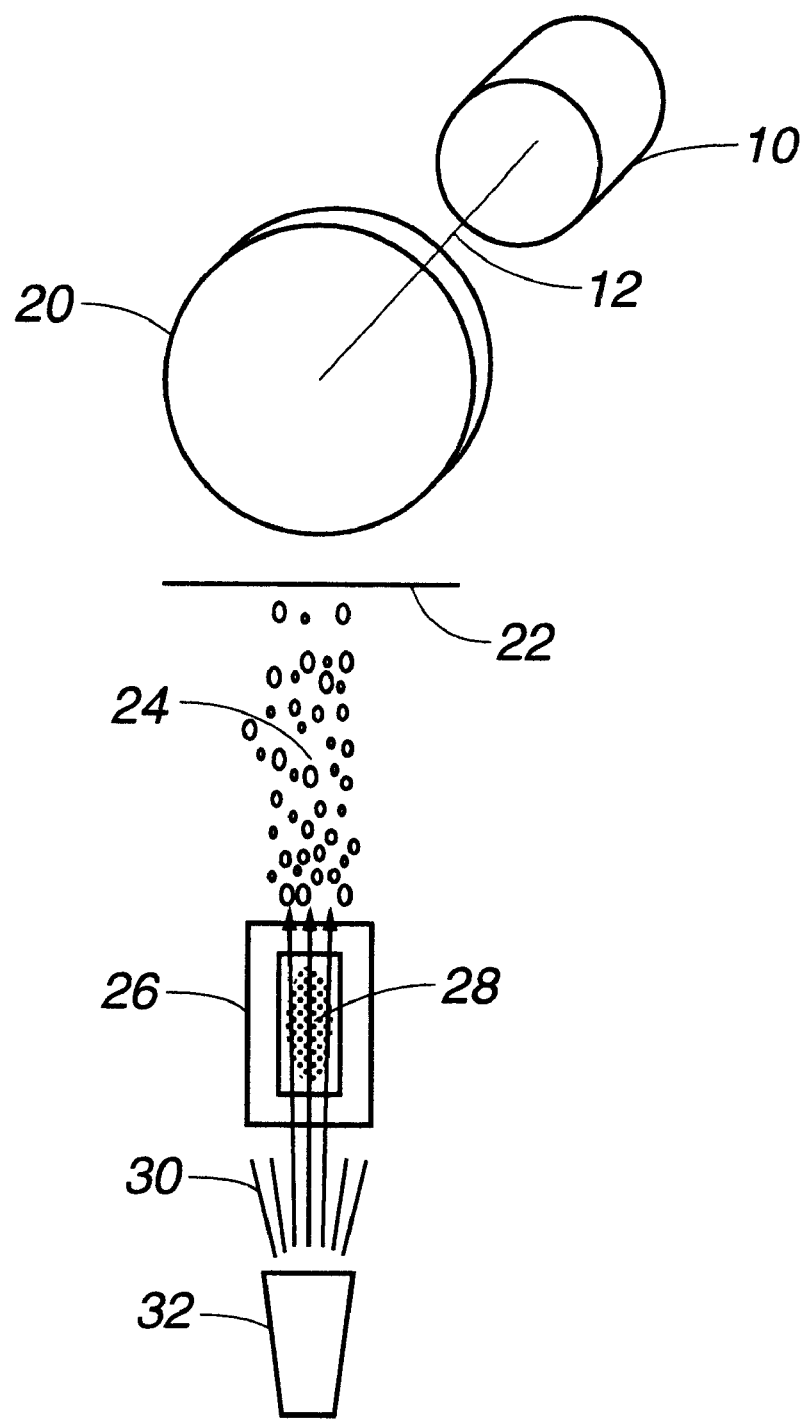
FIG. 3 is a schematic of an alternative embodiment of the invention in which a stepper motor is used for rotating the substrate holder.

Alternatively, a stepper motor could be used to rotate the substrate during deposition. Driver electronics are used to rotate the motor shaft quickly to the selected deposition positions and to stop rotation of the shaft and substrate in each of the selected deposition positions for the selected amounts of time. FIG. 3 is a schematic of this embodiment which allows any crystal symmetry to be produced by simply changing the external programming of the driver electronics used to move the stepper motor.

A stepper motor 11 is connected by shaft 12 directly to the substrate holder 20.

The oriented crystal layer is deposited by a single ion beam source 26 in the same manner as that described for operation of the embodiment of the invention shown in FIG. 1.

When a stepper motor is used, a simple computer program stored in the motor controller drives the motor and determines the length of time that the substrate remains stationary and the degree of rotation.

Very smooth single crystal and single crystal-like films with in-plane orientation can be produced on substrates such as tapes, or plates of glass or other amorphous substrates using the invention. Oriented hexagonal crystal materials and most all cubic materials can be made in this form using the invention methods and apparatus.

The coated materials produced using the invention methods and apparatus are stress free, as indicated by lack of curvature as measured on glass substrates. The films and substrate remain flat over about 4 to 5 millimeters to a few hundred angstroms. This means that the total out-of-plane bending of the substrate due to the thin film stress is nearly zero. Lack of intrinsic stress in these films can be important because stress introduced in the subsequent semiconductor or high temperature superconducting films would reduce the quality of the semiconductor or high temperature superconducting materials.

When films are coated with several layers of oriented crystal like material, the last layers on the film are the most oriented, thus allowing near perfect growth of an additional layer, such as a buffer layer or layer of material such as silicon, diamond, high temperature superconductor material or other materials which are desired in a single crystal form.

With the choice of the proper substrate, seed layers can be grown on which high quality silicon, gallium arsenide, diamond, or other semiconductor materials may be deposited. Examples include applications such as chips on glass.

The invention makes possible initial deposition rates orders of magnitude greater than the more complex two-ion-gun techniques presently used. Using a take up spool and feed spool with the present invention, very long continuous strips of seed layer tape can be produced in a rapid, continuous production operation, thereby enabling mass production of superconducting tapes.

The invention process can be used to produce better silicon for active matrix liquid crystal displays, or for drivers in plasma displays or other driver decoder applications in flat panel displays.

Tapes and slabs of material having the highest current densities in the world can be mass produced using the invention apparatus and method.

Although some heating of the substrate is produced by the evaporation process and the energy from the ion beam source, because no direct heat is involved in the invention process, the invention method and apparatus can be used to create layers of materials such as silicon on substrates such as sapphire which would otherwise not be possible because of thermal expansion mismatches. Also, because no direct heat is involved, other materials such as high temperature plastics can be coated using the invention methods and apparatus.

EXAMPLE

To demonstrate operability of the invention, an invention device was set up with a DC vacuum motor arranged to rotate a substrate holder over a flow through ion beam source in a manner substantially similar to that shown in the schematic of FIG. 1.

The substrate was placed over the ion beam source and magnesium oxide feedstock material was evaporated through the ion beam source to produce an oriented film.

A glass microscope slide abut 1"×3"×0.05" was used as a substrate. Glass was selected as a substrate because the amorphous glass, lacking any crystal structure, would not seed, assist or otherwise influence the crystal formation or orientation.

The substrate was placed on the substrate holder which was attached to a shaft of a DC vacuum motor.

The substrate was inclined at an angle of about 28° relative to the beam from the ion beam source.

The flow through ion beam source was operated in the manner described in U.S. Pat. No. 5,601,654 using oxygen as the plasma gas. The clocking motor was turned on and the substrate rotated over the ion beam. The substrate was rotated in a clocking fashion, turning 90° at a time about the shaft axis at a rate of about 0.5 seconds during the turning portions of the cycle and held in position for about 30 seconds in between turning portions of the cycle.

The running ion beam source allowed the surface contamination to be cleaned off the substrates while the ion beam source was warming up the feedstock material for the film.

Then the ion beam source power was slowly increased until the rate of deposition reached about 2 to 4 angstroms per second. This is the actual rate that determined the thickness of the film produced.

The thin film monitor was calibrated so that for a given set of ion beam conditions and feedstock material being deposited through the ion beam source, the desired film thickness was recorded, including both the film accumulation and the sputter removal due to the energetic ions. Deposition and removal of the thin film was occurring simultaneously. The angle of the substrate relative to the beam angle was also included in the calibration of this rate.

The calibration was made by depositing a thin film, measuring the actual thickness, and then programming the thin film monitor to match the observed coating thickness. This process was repeated several times to establish the correct calibration with 10% accuracy.

The coating was applied to the substrate in the manner described above for a period of about 2 hours. A thin film of magnesium oxide from about 0.5 to 1 micron thick was produced. The coated substrate was then removed from the substrate holder and analyzed by X-ray diffraction. A phi scan was made of the film using a special goniometer on the X-ray machine.

Figure 4:
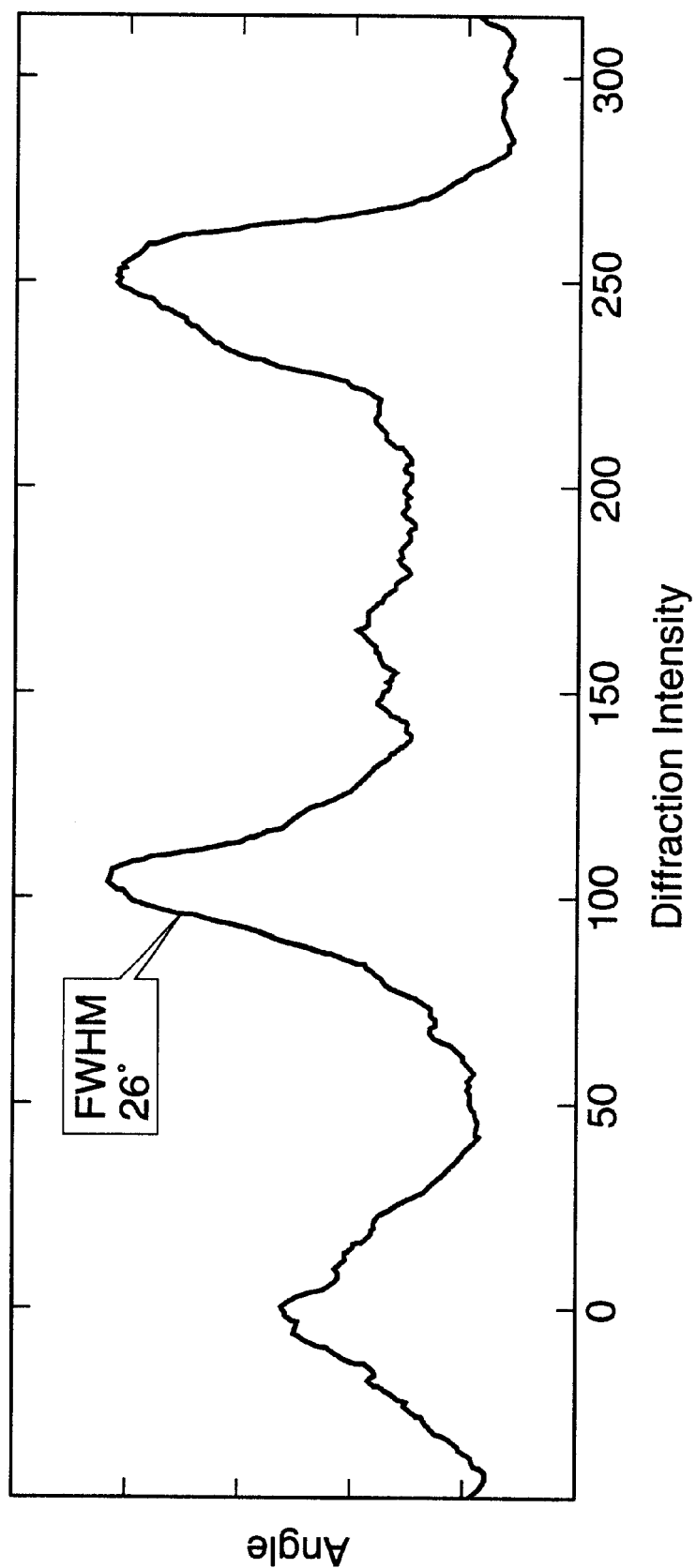
FIG. 4 is an X-ray pole figure indicating the degree of orientation of crystals in a thin film layer produced using the invention method and apparatus.

The X-ray data showed in plane orientation of about 26 degrees for the full width half maximum of the peaks. This meant that not only was the film oriented perpendicular to the plane of the glass slide, but also in the plane of the slide. Therefore, the angular deviation of the majority of crystallites in the film from one direction in film plane were ±13° from that direction. The plot of diffraction intensity versus angle in FIG. 4 shows this data.

Figure 5:
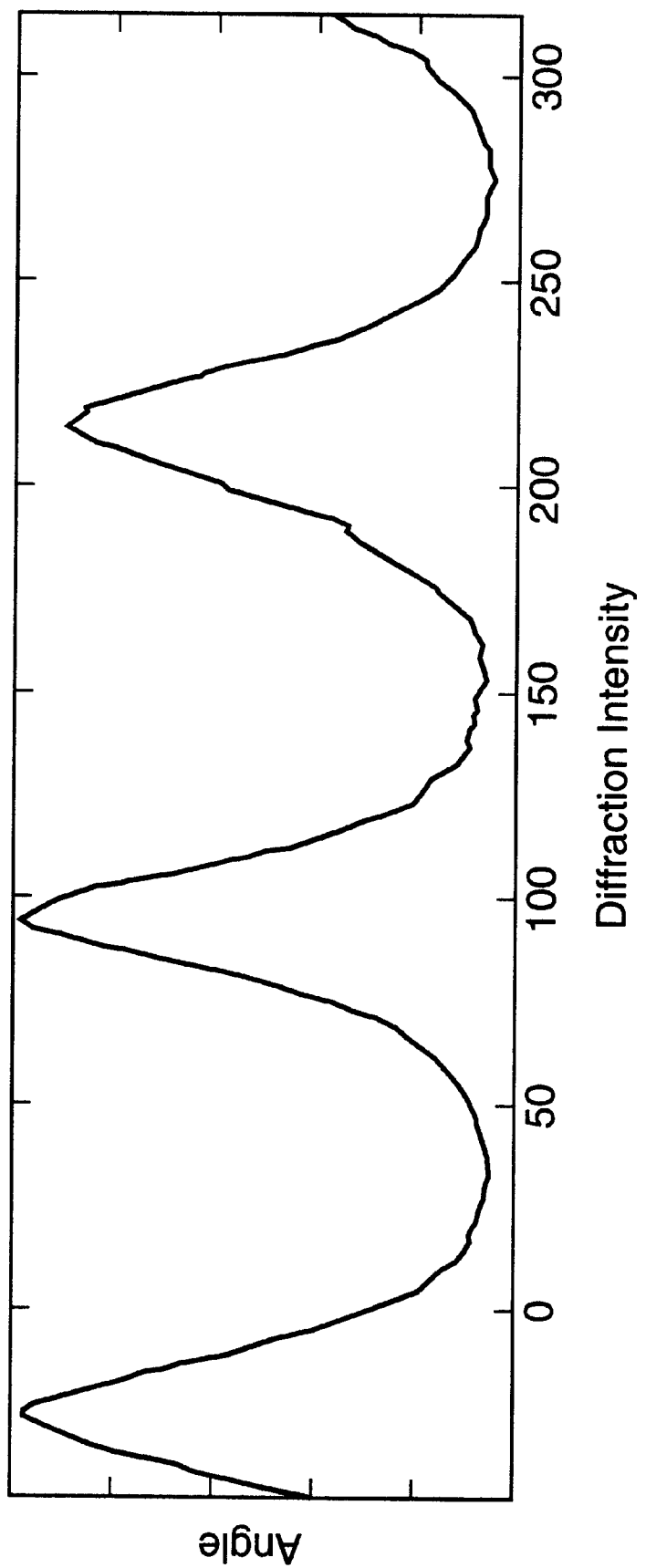
FIG. 5 is an X-ray pole figure showing 111 crystal orientation of a magnesium oxide layer applied to a glass substrate using the invention method and apparatus.

Similarly, a thin film of magnesium oxide with 111 crystal orientation was applied to a glass substrate using the same procedure. An X-ray pole figure of the result is shown in FIG. 5.

While the apparatuses, articles of manufacture, methods and compositions of this invention have been described in detail for the purpose of illustration, the inventive apparatuses, articles of manufacture, methods and compositions are not to be construed as limited thereby. This patent is intended to cover all changes and modifications within the spirit and scope thereof.

INDUSTRIAL APPLICABILITY

The invention apparatuses, methods and materials can be used to make oriented single crystal or single crystal like layers on substrates. These products are useful as electronic materials, particularly as high temperature semiconductor materials. For example, high quality silicon or diamond materials for semiconductor applications can be made using the invention apparatus and process.

What is claimed is:

1. An apparatus for forming oriented crystal layers comprising:

(a) a substrate holder attached to the shaft of a vacuum motor;

(b) a vacuum switch operably connected to said vacuum motor;

(c) a timing device connected to said vacuum switch;

(d) a lobed cam rotatably mounted on said shaft of said vacuum motor;

(e) a cam follower which turns said vacuum motor switch to a closed position each time it reaches a low point of the cam; and (f) an ion beam source positioned to contact a workpiece in said substrate holder with electrons and ions.

2. An apparatus as recited in claim 1, wherein said timing device comprises an integrated circuit.

3. An apparatus as recited in claim 1 wherein said lobed cam has three lobes.

4. An apparatus as recited in claim 1 wherein said lobed cam has four lobes.

5. An apparatus as recited in claim 1 wherein said lobed cam has six lobes.

6. An apparatus as recited in claim 1 wherein said lobed cam has eight lobes.

7. An apparatus as recited in claim 1 wherein said ion beam source is a flow through ion beam gun.

8. An apparatus as recited in claim 1 wherein said substrate holder is enclosed in an atmosphere-controlled container.

9. An apparatus as recited in claim 1 wherein said substrate is mounted in a manner that permits rotation through different angles with respect to the axis of said ion beam source.

10. An apparatus as recited in claim 1 wherein said beam source is mounted in a manner which permits changes in angle of ion deposition with respect to said substrate.

11. An apparatus for forming oriented crystal layers comprising:

(a) a stepper motor;

(b) electronics to drive said stepper motor;

(c) a substrate holder attached to the shaft of said motor; and (d) an ion beam source positioned to deposit ions onto a substrate in said substrate holder.

12. An apparatus as recited in claim 11 wherein said electronics comprise a timing device to start and stop said stepper motor.

13. An apparatus as recited in claim 11 wherein said ion beam source is a flow through ion beam gun.

14. An apparatus as recited in claim 11 wherein said substrate holder is enclosed in an atmosphere-controlled container.

15. An apparatus as recited in claim 11 wherein said substrate is mounted in a manner that permits rotation through different angles with respect to the axis of said ion beam source.

16. An apparatus as recited in claim 11 wherein said ion beam source is mounted in a manner which permits changes in angle of ion deposition with respect to said substrate.

* * * * *